United States Patent [19]

Liu et al.

[11] Patent Number: 4,612,645
[45] Date of Patent: Sep. 16, 1986

[54] FAST POLARIZATION-SWITCHABLE SEMICONDUCTOR LASERS

[75] Inventors: Jia-Ming Liu, Arlington, Mass.; Ying-Chih Chen, Closter, N.J.

[73] Assignee: GTE Laboratories Incorporated, Waltham, Mass.

[21] Appl. No.: 683,776

[22] Filed: Dec. 19, 1984

[51] Int. Cl.$^4$ .............................................. H01S 3/19
[52] U.S. Cl. ........................................ 372/45; 357/17
[58] Field of Search ................ 372/44, 45, 19; 357/17

[56] References Cited

U.S. PATENT DOCUMENTS 4,340,966 7/1982 Akiba et al. ............................ 372/45
4,383,319 5/1983 Shimizu et al. ........................ 372/45
4,546,479 10/1985 Ishikawa et al. ....................... 372/45

OTHER PUBLICATIONS

D. Akhmedov et al, "Effect of Internal Strain on the Polarization of the Emission in InP–InGaAsP Heterojunction Laser Structures", *Sov. Tech. Phys. Lett.*, 6(6), Jun. 1980, pp. 304–305.

D. C. Craft et al, "Anomalous Polarization Characteristics of 1.3-μm InGaAsP Buried Heterostructure Lasers", *Appl. Phys. Lett.*, 44(9), 1 May 1984, pp. 823–825.

*Primary Examiner*—James W. Davie
*Attorney, Agent, or Firm*—Martha Ann Finnegan

[57] ABSTRACT

The laser device of the present invention comprises: a semiconductor substrate; a first cladding layer of semiconductor formed on the substrate; an active layer of semiconductor formed on the first cladding layer, thereby forming a junction plane between the active layer and the first cladding layer; a second cladding layer of semiconductor formed on the active layer and a cap layer of semiconductor formed on the second cladding layer; the active layer having a lattice constant parallel to the junction plane sufficiently larger than the lattice constant normal to the junction plane so as to increase the optical gain of the TM mode relative to the optical gain of the normally operating TE mode, such that at a first injection current level, the laser device operates in the TM mode and at a second injection current level, the laser device operates in the TE mode. The laser output of the laser device of the present invention can be switched between a pure TM mode and a pure TE mode with nanosecond response time by varying injection current levels of the device.

3 Claims, 8 Drawing Figures

4,612,645

FAST POLARIZATION-SWITCHABLE SEMICONDUCTOR LASERS

BACKGROUND OF THE INVENTION

This invention relates to a semiconductor laser. More particularly, it is concerned with a polarization-switchable semiconductor laser.

Optical modulators and especially switches are important components for optical communications and optical data transmission. Conventional optical polarization switching is achieved by electro-optic or acousto-optic modulation of light waves. An electro-optic polarization switch changes the polarization of light waves in response to an electrical signal applied to a passive material through which light is propagating. The acousto-optic effect changes the optical property of a passive material by mechanical strains induced by the passage of an acoustic wave. In both cases, the switching is limited by the speed of the externally applied electrical or acoustic signal. The electro-optic switches have advantages over the acoustooptic devices and are the most commonly used passive switching devices at the present time. However, in order to switch the polarization of light from the transverse electric (TE) mode to the transverse magnetic (TM) mode or vice versa, a large electric field of the order of 10 kV/cm is generally needed.

SUMMARY OF THE INVENTION

In accordance with the present invention there is provided a polarization-switchable semiconductor laser device whereby the laser output can be switched between a pure TM mode and a pure TE mode with nanosecond response time by varying injection current levels of the device. The laser device of the present invention comprises a semiconductor substrate, a first cladding layer of semiconductor formed on the substrate, an active layer of semiconductor formed on the first cladding layer, thereby forming a junction plane between the active layer and the first cladding layer, a second cladding layer of semiconductor formed on the active layer, and a cap layer of semiconductor formed on the second cladding layer, the active layer having a lattice constant parallel to the junction plane sufficiently larger than the lattice constant normal to the junction plane so as to increase the optical gain of the TM mode relative to the optical gain of the TE mode, such that at a first injection current level, the laser device operates in the TM mode and at a second injection current level, the laser device operates in the TE mode.

DETAILED DESCRIPTION OF THE INVENTION

Figure 1:
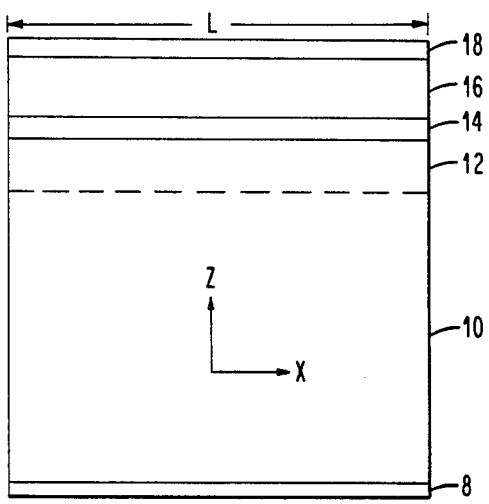
FIG. 1 is a schematic representation of a conventional double heterostructure semiconductor laser device.

Semiconductor lasers normally operate in the TE mode, i.e., the electric field is parallel to the junction, because of the higher mirror reflectivity of the TE mode compared to that of the TM mode. In the TM mode, the electric field is normal to the junction.

The present invention facilitates direct polarization switching in semiconductor lasers. The polarization switching of the laser output is achieved by a relative change in the net gain of the TM and TE modes through a small perturbation of the junction temperature induced by the injection current. The switching has high extinction ratios and can take place within approximately one nanosecond when the laser is driven by fast rising current pulses. The operation is controlled solely by the level of the driving current. No external controlling signal is required. In order for the device of the present invention to be operable, internal strain must exist in the active layer of the device. The necessary strain is created by introducing a prescribed amount of lattice mismatch between the crystal lattice of the active layer and the crystal lattices of the cladding layers and substrate. The active layer must have a lattice constant parallel to the junction plane which is sufficiently larger than the lattice constant of the active layer normal to the junction plane so as to induce a larger optical gain of the TM mode relative to the optical gain of the normally operating TE mode. By increasing the optical gain of the TM mode relative to the optical gain of the TE mode in this manner, the laser device operates in a TM mode at a first injection current level, and in the TE mode at a second injection current level which is above the polarization switching current.

The laser device of the present invention comprises: a substrate; a first cladding layer of semiconductor formed on the substrate; an active layer of semiconductor formed on the first cladding layer, thereby forming a junction plane between the active layer and the first cladding layer; a second cladding layer of semiconductor formed on the active layer, and a cap layer of semiconductor formed on the second cladding layer; said active layer having a lattice constant parallel to the junction plane sufficiently larger than the lattice constant normal to the junction plane so as to increase the optical gain of the TM mode relative to the optical gain of the TE mode, such that at a first injection current level, the laser device operates in the TM mode and at a second injection current level, the laser device operates in the TE mode.

The thicknesses of the layers of the laser device of the present invention are similar to the thicknesses of the layers in typical heterostructure semiconductor laser device. For example, in the device of the present invention, the thickness of the cap layer is greater than 0 $\mu$m but less than or equal to about 1 $\mu$m; the thickness of the second cladding layer is greater than or equal to about 1 $\mu$m but less than or equal to about 3 $\mu$m; the thickness of the active layer is greater than or equal to about 0.05 $\mu$m, but less than or equal to about 0.3 $\mu$m; the thickness of the first cladding layer is greater than or equal to about 1 $\mu$m, but less than or equal to about 3 $\mu$m; and the thickness of the substrate is at least 40 $\mu$m. The thickness of the substrate is selected to facilitate handling of the device. These thicknesses are given by way of example only. The various layers in the device of the present invention may have thicknesses outside of the exemplary ranges set forth above.

FIG. 1 shows the structure of a typical double heterostructure semiconductor laser device. The laser device includes an n-side ohmic contact 8; a substrate 10; a first cladding layer of semiconductor 12; an active layer of semiconductor 14; a second cladding layer of semiconductor 16; and a cap layer of semiconductor to provide p-side ohmic contact 18. In a typical double heterostructure InGaAsP/InP semiconductor laser device, the substrate 10 consists of InP, the first cladding 12 consists of n-InP; the active layer 14 consists of $In_{1-x}Ga_xAs_yP_{1-y}$ wherein $0<x<1$, $0<y\leq 1$ and $x=0.47y$; and the second cladding layer 16 and the cap layer 18 consists of $In_{1-u}Ga_uAs_vP_{1-v}$ wherein $0<v\leq 1$ and $u=0.47v$ consists of p-InP. In a typical double heterostructure AlGaAs/GaAs semiconductor laser device, the substrate 10 consists of n-GaAs, the first cladding layer 12 consists of $n-Al_xGa_{1-x}As$ wherein $0<x<1$; the active layer 14 consists of $Al_yGa_{1-y}As$ wherein $0\leq y<x$, and the second cladding layer 16 consists of $p-Al_xGa_{1-x}As$ wherein $0<x<1$.

The internal strain can be created in the active layer by controlling the liquid phase epitaxy (LPE) growth conditions so that lattice mismatch exists between the epitaxial active layer and the epitaxial cladding layers and the substrate at the growth temperature. As the temperature is decreased, additional lattice mismatch is created due to the difference of thermal expansion coefficients in the active layer and the cladding layers and substrate. This thermally induced strain causes well-behaved, TE-polarized InGaAsP/InP lasers to become purely TM-polarized at low temperatures.

A study of the temperature-dependent polarization behavior of conventional InGaAsP/InP lasers was conducted on buried heterostructure lasers which operate at 1.30 μm wavelength. The InGaAsP/InP lasers studied had a crescent-shaped active layer approximately 0.2 μm in thickness, which was buried in a grooved InP substrate. The lasers operated in the fundamental transverse mode and multiple longitudinal modes. The FWHM of the lasing spectrum is typically 30 Angstroms.

Figure 2A:
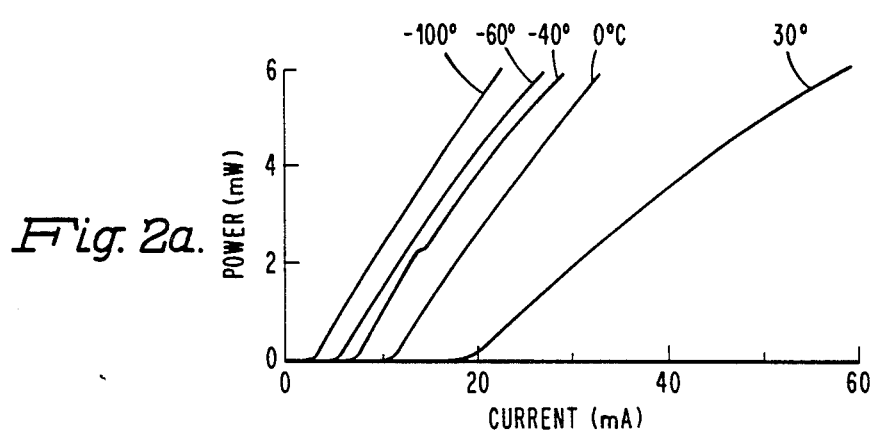
FIGS. 2(a) and 2(b) show graphical representations of the pulsed power—current characteristics of an InGaAsP/InP laser.
Figure 2B:
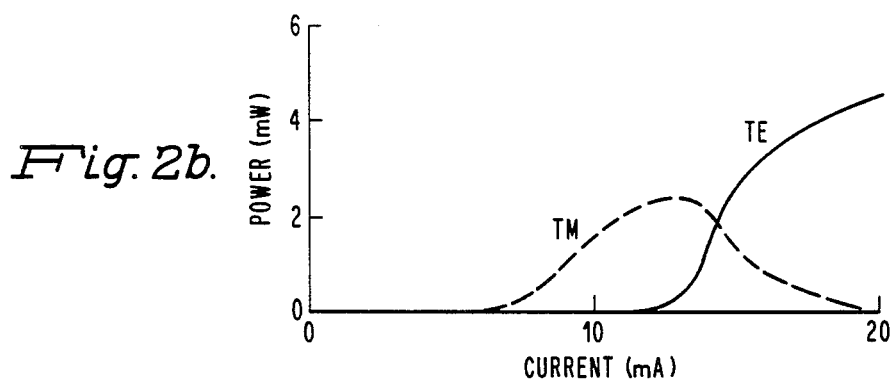

FIG. 2(a) is a graphical representation of the pulsed power-current (P-I) characteristics of a typical InGaAsP/InP laser at various temperatures. At room temperature and above, the laser operates in a pure TE mode. When the temperature is lowered to a critical temperature, the laser output starts to show a mixture of TE and TM modes. The critical temperature of the laser represented in FIG. 1(a) is −40° C. The TM mode gradually becomes dominant with decreasing temperature and the laser operates exclusively in the TM mode at temperatures 10° C. lower than the critical temperature. When the laser operates in a pure TE or TM mode, the P-I curves are kink free. The detailed behavior of the mode transition process is illustrated by the polarization resolved P-I curves in FIG. 2(b).

The polarization change of the InGaAsP/InP lasers at low temperatures is attributed to a relative change in the optical gain of the two modes, caused by the thermally-induced internal stress in the active layer. The thermal expansion coefficient of the InGaAsP active layer is larger than that of the InP substrate. As the temperature decreases, the active layer experiences a tensile stress along the junction plane. As a result, the lattice constant parallel to the junction plane becomes larger than that normal to the junction. The deformed lattice structure is equivalent to that created when a uniaxial compressive stress is applied normal to the junction. This lattice deformation leads to an increase in the probability of the TM emission.

Following is a stress analysis for the typical $In_{1-x}Ga_xAs_yP_{1-y}$ double heterojunction structure shown in FIG. 1. Assuming that the substrate is much thicker than the epitaxial layers, the stress in the active layer caused by a temperature change, ΔT, can be expressed by:

$$\sigma_{xx} \simeq -\frac{E}{1-\nu} \frac{(t_s + 2t_c - 3t_a)}{t} \Delta\alpha_i \Delta T$$

where E is the Young's modulus, ν is the Poisson's ratio, t is the total thickness of the device, $t_s$ is the thickness of the substrate, $t_c$ is the thickness of one cladding layer, $t_a$ is the thickness of the active layer, and $\Delta\alpha_i = \alpha_{InGaAsP} - \alpha_{InP}$ is the difference of the thermal expansion coefficients of InGaAsP and InP. (R. H. Saul, *J.Appl. Phys.*, 40, 3273(1969); W. A. Brantley, ibid., 44, 534 (1973); R. K. Reinhart and R. A. Logan, ibid., 44, 3171 (1973).) It is assumed that the two cladding layers have equal thicknesses.

As an example, consider a laser with (100) substrate operating at λ=1.3 μm, which corresponds to y=0.64, (S. Adachi, ibid., 53, 8775 (1982).) For a typical $In_{1-x}Ga_xAs_{1-y}P$ /InP laser structure with y=0.64, $E=6.5\times 10^{11}$ dyn/cm², ν=0.431, $\alpha_{InGaAsP}=5.37\times 10^{-6}/°C$., $\alpha_{InP}=4.56\times 10^{-6}/°C$., and $\sigma_{xx}=-8\times 10^5$ ΔT dyn/cm²°C., which is tensile when ΔT<0. For a typical $In_{1-x}Ga_xAs_yP_{1-y}$ double heterojunction structure with typical layer dimensions of $t_s=75$ μm, $t_c=1$ μm, and $t_a=0.2$ μm, the strain normal to the junction is given by $$\epsilon_{zz} = -\frac{2\nu}{E}\sigma_{xx} = 8.4 \times 10^{-7} \Delta T/°C.$$

The lattice deformation in the active layer caused by this strain per degree decrease of temperature is equivalent to the effect of an external uniaxial compressive stress of 0.82 atm normal to the junction. According to N. K. Dutta, ibid., 55, 285 (1984), the relative increase in the optical gain of the TM mode over the TE mode induced by a uniaxial compressive stress is 0.14 cm⁻¹/atm. Based on this analysis, cooling of the laser should induce a relative increase in the TM optical gain of 0.115 cm⁻¹/°C. A temperature change of −40° C. to −100° C. from the room temperature will offset this gain difference completely, resulting in TM mode operation of the InGaAsP laser.

When a semiconductor laser is operated in the polarization transition regime, at a few degrees below the critical temperature, the P-I curve, in general, has many kinks at different power levels caused by complex transverse mode competition among the fundamental and higher order TE and TM modes. In the simplest case, the P-I curve exhibits a kink at a transition current $I_{c1}$, which is associated with the $TM_{00}$ to $TE_{00}$ mode transition. A second kink is observed at a higher current, $I_{c3}$, above which the laser starts to operate in a mixture of TE and TM modes due to spatial hole burning. The laser output is purely TM-polarized at low injection currents. If there is a window between $I_{c1}$ and $I_{c2}$, it can be switched to the TE mode when the amplitude of the current is above $I_{c1}$, large enough to locally raise the junction temperature above $T_c$. The temperature change needed to induce the switching is of the order of approximately 1° C. This 1° C. temperature change can be achieved by controlling the level of the injection current. This polarization change is attributable to a thermally-induced stress effect resulting from the difference in the thermal expansion coefficients of the InGaAsP active layer and the InP cladding layers and the InP substrate. The thermal-stress effect in the InGaAsP active layer induces a relative change in the optical gain of the two modes.

Figure 3:
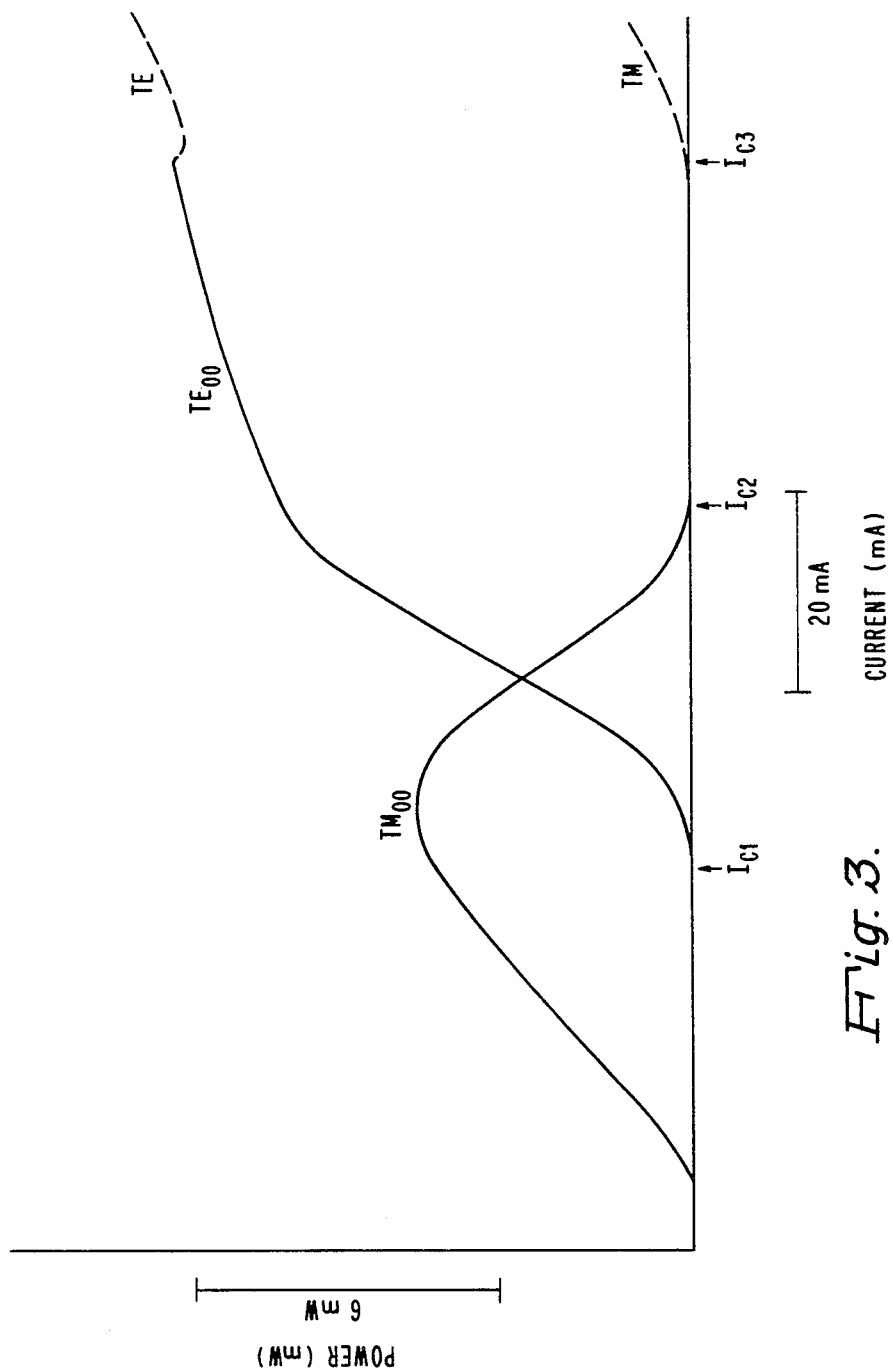
FIG. 3 shows polarization resolved power current characteristics of a polarization-switchable InGaAsP/InP laser of the present invention.
Figure 4A:
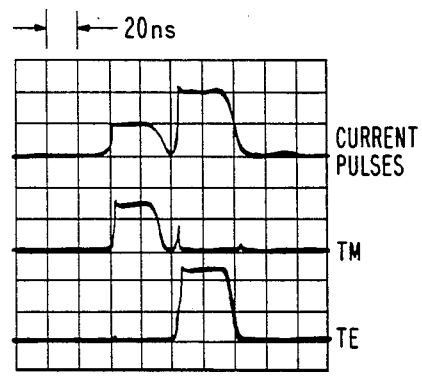
FIGS. 4(a) and 4(b) show the pulse waveforms of a polarization-switchable InGaAsP/InP laser of the present invention by two successive pulses with amplitudes above and below the transition current.
Figure 4B:
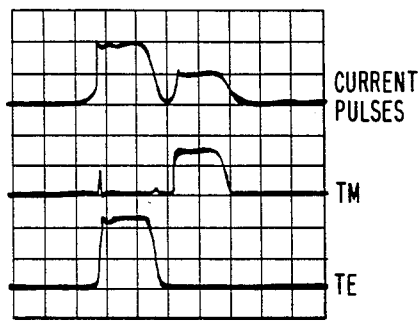

To demonstrate this switching behavior, an InGaAsP/InP buried heterostructure laser with a large window between $I_{c1}$ and $I_{c2}$ was selected. The critical temperature of the laser was found to be about −68° C. The polarization-resolved power-current characteristics, taken within the transition regime at −71° C., are shown in FIG. 3. The pulse waveforms of the laser driven by two successive 30-ns current pulses with amplitudes above and below the transition current, $I_{c1}$, are shown in FIGS. 4(a) and 4(b). In FIG. 4(a) where the smaller current pulse leads the larger one, the output of the laser switches from a TM-polarized pulse to a TE-polarized pulse. When the larger current pulse takes the lead, the laser switches from TE to TM, as shown in FIG. 4(b).

The extinction ratio of the switching, defined as the ratio of the energy of the pulse in the operating polarization to that of the remnant in the orthogonal polarization, is very high. For currents below $I_{C1}$, the stimulated emission is purely TM-polarized. The extinction ratio is only limited by the amount of spontaneous emission in the TE polarization. In the case of FIG. 3 where the amplitude of the smaller current pulses is close to $I_{c1}$, $I_{c1}$=40 mA for this example, the extinction ratio is 60. For currents above $I_{c1}$, the TE emission switches on immediately following a small transient TM emission in the leading edge of the pulse. When the laser is driven by a long current pulse with amplitude slightly above $I_{c1}$, the transition from TM to TE can take several hundred nanoseconds. In the switching operation with fast-rising current pulses of sufficiently high amplitude above $I_{c2}$, $I_{c2}$=80 mA for this example, detector-limited transient TM spikes as short as 200 ps are observed. The current pulses in FIGS. 4(a) and 4(b) have a rise time of 2 ns. The duration of the corresponding transient TM spikes is less than 2 ns. This transient spike is determined by the rise time and the amplitude of the current pulse and is not affected by the change in the duration of the pulse. For the 30-ns pulses in FIGS. 4(a) and 4(b), the total energy in the TM spike is about 1/70 of that in the TE pulse. When the TM spontaneous emission is included, the overall extinction ratio for the TE operation is about 40. The extinction ratio for the TE operation increases with increasing pulse duration for nanosecond pulses. The transient TM emission can be further shortened by increasing the amplitude of the driving current pulse. However, the maximum extinction ratio for the TE mode is limited by a spatial hole-burning effect which causes the laser to operate in a mixture of TE and TM modes in the presence of a very strong TE mode. In this example, the hole burning occurs at a very high power level corresponding to $I_{c3}$=120 mA. In some lasers, however, spatial hole burning occurs prematurely at currents less than $I_{c2}$ or $I_{c1}$, which results in low extinction ratios for the TE operation.

Polarization switching can be operated quite successfully with various combinations of nanosecond pulses of different durations and amplitudes, the pulses being separated by as little time as 2 nanoseconds. The pulse shape and polarization of the second laser pulse is solely controlled by the level of the second current pulse and is not influenced by the presence of the first pulse. This indicates that cooling of the junction after a current pulse is a fast process. Cooling of an active layer of 2180.2 μm thickness has a subnanosecond time constant. The subnanosecond cooling rate is important for reducing bit pattern effects. When the laser is continuously driven by a train of current pulses, the fast cooling rate should also allow fast polarization switching of the laser, except that the operating temperature needs to be appropriately lowered to compensate for the average junction heating.

For conventional AlGaAs/GaAs double heterostructure laser devices, having the structure design shown in FIG. 1, thermally induced stress cannot cause enough strain in the active layer to induce the TM mode because the stress in the active layer caused by the cladding layers is largely offset by the GaAs substrate. Two alternative AlGaAs/GaAs structures, which permit sufficient stress to be induced in the active layer are shown in FIGS. 5(a) and 5(b).

Figure 5A:
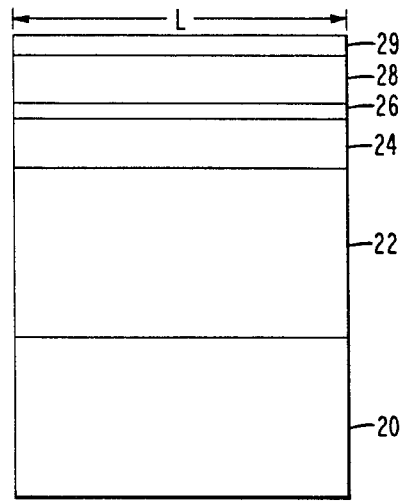
FIGS. 5(a) and 5(b) are schematic representations of polarization-switchable AlGaAs/GaAs laser devices of the present invention.
Figure 5B:
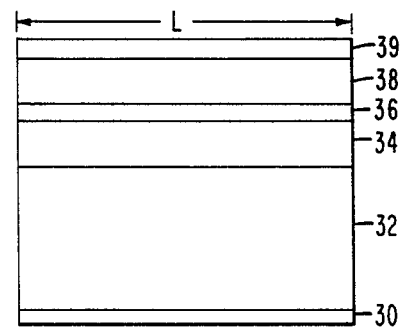

The AlGaAs/GaAs semiconductor laser of FIG. 5(a) includes a GaAs substrate 20; an $Al_zGa_{1-z}As$ buffer layer 22; a first $Al_xGa_{1-x}As$ cladding layer 24; an $Al_yGa_{1-y}As$ active layer 26; a second $Al_xGa_{1-x}$. As cladding layer 28; and a GaAs cap layer 29 to provide an ohmic contact. Appropriate lattice mismatch can be thermally induced in the laser device represented in FIG. 5(a), provided that in the $Al_yGa_{1-y}As$ active layer 26, $0 \leq y < 0.2$; in the two $Al_xGa_{1-x}As$ cladding layers 24, 28, $y<x$; and in the $Al_zGa_{1-z}As$ buffer layer 22, $y<z$. The variable z in the $Al_zGa_{1-z}As$ composition of the buffer layer is also related to the thickness and composition of the individual layers of the AlGaAs/GaAs laser device.

For TM mode operation, the stress, $\sigma_{xx}$, in the active layer must be $10^8$ dyn/cm². The thickness, $d_2$, of the buffer layer and the composition of the buffer layer can be calculated by the equation $$\sigma_{xx} = \frac{E * \Delta\alpha\Delta T}{d}\{zd_2 + xd_3 + xd_5 - yd\} + \frac{E}{2R} *$$

$$(d_1 + d_2 + d_3 - d_5 - d_6)$$

wherein
$d_1$ is the thickness of the GaAs substrate;
$d_2$ is the thickness of the $Al_zGa_{1-z}As$ buffer layer;
$d_3$ is the thickness of the first $Al_xGa_{1-x}As$ cladding layer;
$d_4$ is the thickness of the $Al_yGa_{1-y}As$ active layer;
$d_5$ is the thickness of the second $Al_xGa_{1-x}As$ cladding layer;
$d_6$ is the thickness of the GaAs cap layer;
x is the aluminum content of the first and second $Al_xGa_{1-x}As$ layers;
y is the aluminum content of the $Al_yGa_{1-y}As$ active layer; and
z is the aluminum content of the $Al_zGa_{1-z}As$ buffer layer.
$d=d_1+d_2+d_3+d_4+d_5+d_6$, d being the total thickness of the device;

$$\frac{1}{R} \approx -\frac{6\Delta\alpha\Delta T}{d^3} \{(d_1 + d_2)(xd_3 + yd_4 + xd_5) + zd_1d_2\}.$$

assuming $d_1+d_2 >> d_3+d_4+d_5+d_6$. $\Delta T = T-900°$ C., T being the device operating temperature and 900° C. being the temperature at which a perfect lattice-match exists for AlGaAs/GaAs structures;

$$E^* = \frac{E}{1-\nu} = 12.39 \times 10^{11} \text{ dyn/cm}^2;$$

$E=8.53 \times 10^{11}$ dyn/cm$^2$ (Young's modulus);
$\nu = 0.312$ (Poisson's ratio); and
$\Delta\alpha = {}^\alpha\text{GaAs} - {}^\alpha\text{AlAs} = 1.58 \times 10^{-6}/°\text{C}$.

The AlGaAs/GaAs semiconductor junction laser of FIG. 5(b) includes a thinned GaAs substrate 30, an Al$_z$Ga$_{1-z}$As buffer layer 32; a first Al$_x$Ga$_{1-x}$As cladding layer 34; an Al$_y$Ga$_{1-y}$As active layer 36; and a second Al$_x$Ga$_{1-x}$As cladding layer 38; and a GaAs cap layer 39, to provide an ohmic contact. Appropriate lattice mismatch can be thermally induced in the laser device represented in FIG. 5(b), provided that, in the Al$_y$Ga$_{1-y}$As active layer 16, $0 \leq y < 0.2$; in the two Al$_x$Ga$_{1-x}$As cladding layers 34, 38, $y<x$; and in the Al$_z$Ga$_{1-z}$As buffer layer 32, $y<z$. The variable z in the Al$_z$Ga$_{1-z}$As composition of the buffer layer is also related to the thickness and composition of the individual layers of the AlGaAs/GaAs laser device.

For TM mode operation, the stress, $\sigma_{xx}$, in the active layer needs to be $10^8$ dyn/cm$^2$. The thickness, $d_2$, of the buffer layer and the composition of the buffer layer can be calculated by the equation $$\sigma_{xx} = \frac{E^*\Delta\alpha\Delta T}{d}\{zd_2 + xd_3 + xd_5 - yd\} + \frac{E}{2R} *$$

$$(d_1 + d_2 + d_3 - d_5 - d_6)$$

wherein
 $d_1$ is the thickness of the GaAs substrate;
 $d_2$ is the thickness of the Al$_z$Ga$_{1-z}$As buffer layer;
 $d_3$ is the thickness of the first Al$_x$Ga$_{1-x}$As cladding layer;
 $d_4$ is the thickness of the Al$_y$Ga$_{1-y}$As active layer;
 $d_5$ is the thickness of the second Al$_x$Ga$_{1-x}$As cladding layer;
 $d_6$ is the thickness of the GaAs cap layer;
 x is the aluminum content of the first and second Al$_x$Ga$_{1-x}$As layers;
 y is the aluminum content of the Al$_y$Ga$_{1-y}$As active layer; and
 z is the aluminum content of the Al$_z$Ga$_{1-z}$As buffer layer;
where $d = d_1+d_2+d_3+d_4+d_5+d_6$, D being the total thickness of the device; and $$\frac{1}{R} \approx -\frac{6\Delta\alpha\Delta T}{d^3}\{(d_1+d_2)(xd_3+yd_4+xd_5)+zd_1d_2\}$$

assuming $d_1+d_2 >> d_3+d_4+d_5+d_6$. $\Delta T = T-900°$ C., T being the device operating temperature and 900° C. being the temperature at which a perfect lattice-match exists for AlGaAs/GaAs structures;

$$E^* = \frac{E}{1-\nu} = 12.39 \times 10^{11} \text{ dyn/cm}^2;$$

$E=8.53 \times 10^{11}$ dyn/cm$^2$ (Young's modulus);
$\nu = 0.312$ (Poisson's ratio); and
$\Delta\alpha = {}^\alpha\text{GaAs} - {}^\alpha\text{AlAs} = 1.58 \times 10^{-6}/°\text{C}$.

The polarization of the light output of the AlGaAs/GaAs laser devices shown in FIGS. 5(a) and 5(b) can be switched by varying the injection current level when the laser device is operated at a temperature a few degrees below the critical temperature which is a characteristic of the individual laser device. The critical temperature and appropriate injection current levels for the AlGaAs/GaAs laser devices having the structures represented by FIGS. 5(a) and 5(b) are determined in a manner similar to that described above for the conventional InGaAsP/InP laser device.

While there has been shown and described what are considered preferred embodiments of the present invention, it will be obvious to those skilled in the art that various changes and modifications may be made therein without departing from the invention as defined by the appended claims.

What is claimed is:

1. A polarization-switchable semiconductor laser device in which the output of the semiconductor laser device can be switched between a pure TE mode and a pure TM mode by varying laser injection current levels, said device comprising:
 a semiconductor substrate;
  a first cladding layer of semiconductor formed on the substrate;
  an active layer of semiconductor formed on the first cladding layer, thereby forming a junction plane between the active layer and the first cladding layer;
  a second cladding layer of semiconductor formed on the active layer; and
  a cap layer of semiconductor formed on the second cladding layer;
 said active layer having a lattice constant parallel to the junction plane sufficiently larger than the lattice constant of the active layer normal to the junction plane so as to increase the optical gain of the TM mode relative to the optical gain of the TE mode, such that at a first injection current level, the laser device operates in the TM mode and at a second injection current level, the laser device operates in the TE mode.

2. A polarization-switchable semiconductor laser device in accordance with claim 1 wherein the substrate consists of n-InP; the first cladding layer consists of n-InP; the active layer consists of In$_{1-x}$Ga$_x$As$_y$P$_{1-y}$ wherein $0<x<1$, $0<y<1$ and $x=0.47y$, and the second cladding layer consists of p-InP, and the cap layer consists of In$_{1-u}$Ga$_u$As$_v$P$_{1-v}$ wherein $0<v\leq 1$ and $u=0.47v$.

3. A polarization-switchable semiconductor laser device whereby the output of the semiconductor laser device can be switched between a pure TE mode and a pure TM mode by varying laser injection current levels, said device comprising:
 a substrate consisting of GaAs;
 a buffer layer of Al$_z$Ga$_{1-z}$As formed on the substrate;
  a first cladding layer of Al$_x$Ga$_{1-x}$As formed on the buffer layer;
  an active layer of Al$_y$Ga$_{1-y}$As formed on the first cladding layer, thereby forming a junction plane between the active layer and the first cladding layer;
  a second cladding layer of Al$_x$Ga$_{1-x}$As formed on the active layer; and a cap layer of GaAs formed on the second cladding layer;

wherein $0<y<0.2$; $y<x$; and $y<z$; and said active layer having a lattice constant parallel to the junction plane sufficiently larger than the lattice constant of the active layer normal to the junction plane so as to increase the optical gain of the TM mode relative to the optical gain of the TE mode, such that at a first injection current level, the laser device operates in the TM mode and at a second injection current level, the laser device operates in the TE mode.

* * * * *